United States Patent
Kikuchi

(10) Patent No.: US 6,563,321 B2
(45) Date of Patent: May 13, 2003

(54) METHOD AND APPARATUS FOR DETECTING LINE-SHORTS BY POTENTIAL AND TEMPERATURE DISTRIBUTION

(75) Inventor: Hiroaki Kikuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 51 days.

(21) Appl. No.: 09/852,177

(22) Filed: May 10, 2001

(65) Prior Publication Data

US 2001/0040456 A1 Nov. 15, 2001

(30) Foreign Application Priority Data

May 11, 2000 (JP) ........................................ 2000-139128

(51) Int. Cl.[7] ............................................. G01R 31/08
(52) U.S. Cl. ....................................... 324/522; 324/551
(58) Field of Search ................................. 250/307, 310; 324/522, 533, 753, 551; 361/119; 377/100

(56) References Cited

U.S. PATENT DOCUMENTS

| | | | | | |
|---|---|---|---|---|---|
| 5,463,322 A | * | 10/1995 | Kwasnick et al. | ........... | 324/522 |
| 5,466,935 A | * | 11/1995 | Ray et al. | .................. | 250/307 |
| 5,877,631 A | * | 3/1999 | Takahashi | ................... | 324/533 |
| 6,084,238 A | * | 7/2000 | Todokoro et al. | ........... | 250/310 |
| 6,200,022 B1 | * | 3/2001 | Hammiche et al. | ........... | 374/46 |
| 6,373,054 B2 | * | 4/2002 | Hiroi et al. | .................. | 250/310 |
| 6,433,561 B1 | * | 8/2002 | Satya et al. | .................. | 324/753 |

FOREIGN PATENT DOCUMENTS

JP           04-314032           11/1992

OTHER PUBLICATIONS

SATYA; "Microelectronic Test Structures for Rapid Automated Contactless Inline Defect Inspection"; IEEE Transactions on Semiconductor Manufacturing; IEEE; vol. 10, No. 3; Aug. 1997; pp. 384–389.

* cited by examiner

Primary Examiner—N. Le
Assistant Examiner—Walter Benson
(74) Attorney, Agent, or Firm—Foley & Lardner

(57) ABSTRACT

In a method for detecting a line-short between conductive layers, a potential (or temperature) distribution of the conductive layers is detected while applying a DC voltage thereto. The method is particularly applicable to interdigitated conductive layers. A potential distribution across a wide range perpendicular to the conductors is detected to determine a first location of the line short. Potential distributions between conductors at points parallel to the conductors near the first location are then examined to determine a second location where the potential between the conductors is minimal. Potential distribution at points along a conductor are then examined to determine a location where the potential is sharply changed.

28 Claims, 15 Drawing Sheets

METHOD AND APPARATUS FOR DETECTING LINE-SHORTS BY POTENTIAL AND TEMPERATURE DISTRIBUTION

BACKGROUND OF THE INVENTION

1. Field of the Invention

The present invention relates to a method and apparatus for detecting line-shorts between conductive layers of a semiconductor device and the like.

2. Description of the Related Art

Generally, in a semiconductor device or a liquid crystal display (LCD) panel, when line-shorts are generated between conductive layers (wires), fatal electrical faults are caused in the semiconductor device or the LCD panel.

Therefore, it is essential to provide an automated line-shorts inspection method and apparatus for test conductive layers, so that the analysis of line-shorts is fed back to the manufacturing process, which would enhance the manufacturing yield.

In a first prior art method for detecting line-shorts of an LCD panel (see: JP-A-4-314032), a conductive tape is adhered to all gate bus lines and a conductive tape is adhered to all source bus lines. In this case, the conductive tapes and are connected by switches, respectively, to the ground.

In order to detect line-shorts around cross-over portions between the gate bus lines and the source bus lines, first, the respective switches are turned OFF and ON, and then, charged gate bus lines and grounded gate bus lines are monitored by a CRT or the like using a scanning electron microscope (SEM) inspection. In this case, the grounded gate bus lines are related to the line-shorts defects. Next, the respective switches are turned ON and OFF, and then, charged source bus lines and grounded source bus lines are monitored by a CRT or the like using the SEM inspection. In this case, the grounded source bus lines are related to the line-shorts defects. Thus, the locations of the line-shorts can be specified. This will be explained later in detail.

In the above-described first prior art method, however, if the test structures, i.e., the gate bus lines and the source bus lines are very-fined, it is difficult to adhere the conductive tapes thereto. Additionally, if the number of test structures formed on a transparent insulating substrate is large, the adhesion of conductive tapes thereto takes a long time, which would increase the burden of line-shorts inspection. Further, the transparent insulating substrate may be contaminated by the adhesion of the conductive tapes. Furthermore, since the SEM inspection requires vacuum equipment including a vacuum chamber, a vacuum pump, a vacuum meter and the like, the inspection apparatus therefor is expensive.

In a second prior art method for detecting line-shorts (see: Aakella V. S. Satya, "Microelectronic Test Structures for Rapid Automated Contactless Inline Defect Inspection", IEEE Trans. on Semiconductor Manufacturing, Vol. 10, No, 3, pp. 384–389), parallel serpentine test conductive layers are provided to sandwich rows of floating rectangular pads. The test conductive layers are grounded at their ends through a substrate-contact.

In order to detect line-shorts between the conductive layers and the pads, electron beams of a low energy are scanned onto the pads. As a result, secondary-electron peak-intensity profile is displayed on a CRT or the like using the SEM inspection. In this case, the number of secondary electrons emitted from the pads having line-shorts with the conductive layers is made smaller. Thus, the locations of the line-shorts can be specified. This also will be explained later in detail.

In the second prior art method, however, in order to increase the S/N ratio, the area of each of the pads has to be increased, which cannot lengthen the conductive layers. As a result, the conductive layers are far from those of actual products. Also, the substrate-contact for grounding the conductive layers increases the manufacturing steps, which would increase the manufacturing cost. Further, since the SEM inspection requires vacuum equipment including a vacuum chamber, a vacuum pump, a vacuum meter and the like, the inspection apparatus therefor is expensive.

SUMMARY OF THE INVENTION

It is an object of the present invention to provide a method and apparatus for detecting line-shorts of a semiconductor device capable of decreasing the burden of line-short inspection without being expensive.

According to the present invention, in a method for detecting a line-short between conductive layers, a potential (or temperature) distribution of the conductive layers is detected while applying a DC voltage thereto.

Also, in an apparatus for detecting a line-short between conductive layers a scanning potential (or thermal) microscope is provided to detect a potential (or temperature) distribution of the conductive layers while applying a DC voltage thereto.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiments, prior art methods for detecting line-shorts will be explained with reference to FIGS. 1 and 2.

Figure 1:
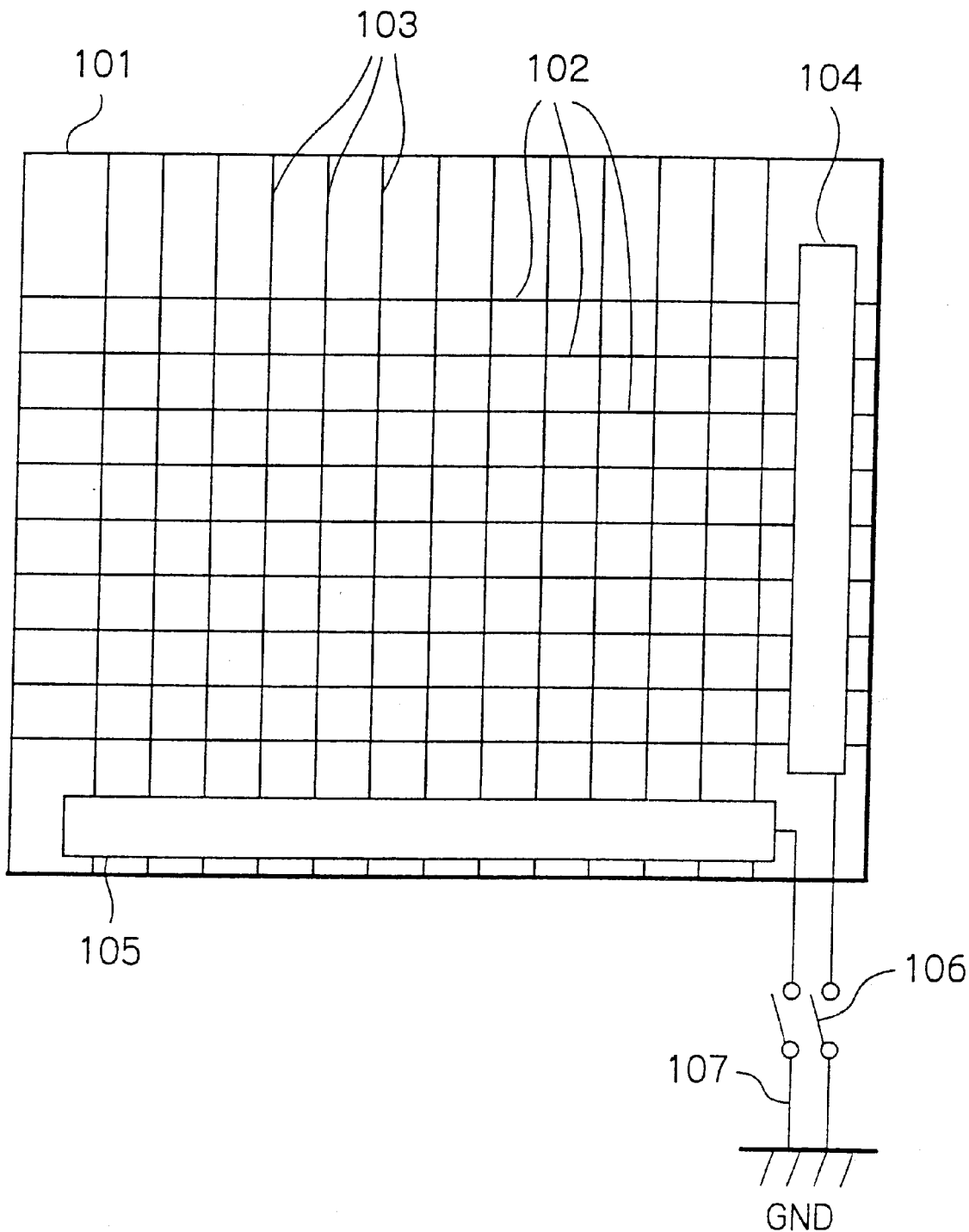
FIG. 1 is a plan view for explaining a first prior art method for detecting line-shorts.

In FIG. 1, which is a plan view for explaining a first prior art method for detecting line-shorts of an LCD panel (see: JP-A-4-314032), reference numeral 101 designates a transparent insulating substrate on which gate bus lines 102 and source bus lines 103 are formed. In this case, the gate bus lines 102 and the source bus lines 103 are perpendicular to each other and are isolated by insulating material (not shown). Also, one pixel (not shown) formed by a thin film transistor (TFT) and a liquid crystal cell is provided at each intersection of the gate bus lines 102 and the source bus lines 103.

Also, a conductive tape 104 is adhered to all the gate bus lines 102 and a conductive tape 105 is adhered to all the source bus lines 103. In this case, the conductive tapes 104 and 105 are connected by switches 106 and 107, respectively, to the ground GND.

In order to detect line-shorts around cross-over portions between the gate bus lines 102 and the source bus lines 103, first, the switches 106 and 107 are turned OFF and ON, respectively, and then, charged gate bus lines and grounded gate bus lines are monitored by a CRT or the like using the SEM inspection. In this case, the grounded gate bus lines are related to the line-shorts defects. Next, the switches 106 and 107 are turned ON and OFF, respectively, and then, charged source bus lines and grounded source bus lines are monitored by a CRT or the like using the SEM inspection. In this case, the grounded source bus lines are related to the line-shorts defects. Thus, the locations of the line-shorts can be specified.

In the first prior art method as illustrated in FIG. 1, however, if the test structures, i.e., the gate bus lines 102 and the source bus lines 103 are very-fined, it is difficult to adhere the conductive tapes 104 and 105 thereto. Additionally, if the number of test structures formed on the transparent insulating substrate 101 is large, the adhesion of conductive tapes thereto takes a long time, which would increase the burden of line-shorts inspection. Further, the transparent insulating substrate 101 may be contaminated by the adhesion of the conductive tapes 104 and 105. Furthermore, since the SEM inspection requires vacuum equipment including a vacuum chamber, a vacuum pump, a vacuum meter and the like, the inspection apparatus therefor is expensive.

Figure 2:
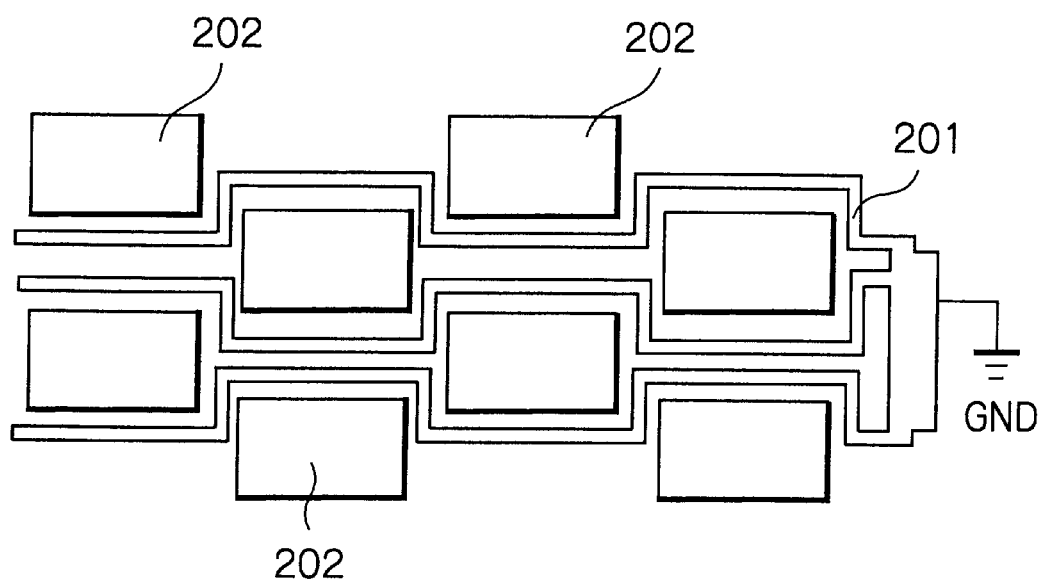
FIG. 2 is a plan view for explaining a second prior art method for detecting line-shorts.

In FIG. 2, which is a plan view for explaining a second prior art method for detecting line-shorts (see: Aakella V. S. Satya, "Microelectronic Test Structures for Rapid Automated Contactless Inline Defect Inspection", IEEE Trans. on Semiconductor Manufacturing, Vol. 10, No. 3, pp. 384–389), parallel serpentine test conductive layers 201 are provided to sandwich rows of floating rectangular pads 202. The test conductive layers 201 are grounded at their ends through a substrate-contact.

In order to detect line-shorts between the conductive layers 201 and the pads 202, electron beams of a low energy are scanned onto the pads 202. As a result, secondary-electron peak-intensity profile is displayed on a CRT or the like using the SEM inspection. In this case, the number of secondary electrons emitted from the pads 202 having line-shorts with the conductive layers 201 is made smaller. Thus, the locations of the line-shorts can be specified.

In the second prior art method as illustrated in FIG. 2, however, in order to increase the S/N ratio, the area of each of the pads 202 has to be increased, which cannot lengthen the conductive layers 201. As a result the conductive layers 201 are far from those of actual products. Also, the substrate-contact for grounding the conductive layers 201 increases the manufacturing steps, which would increase the manufacturing cost. Further, since the SEM inspection requires vacuum equipment including a vacuum chamber, a vacuum pump, a vacuum meter and the like, the inspection apparatus therefor is expensive.

Figure 3:
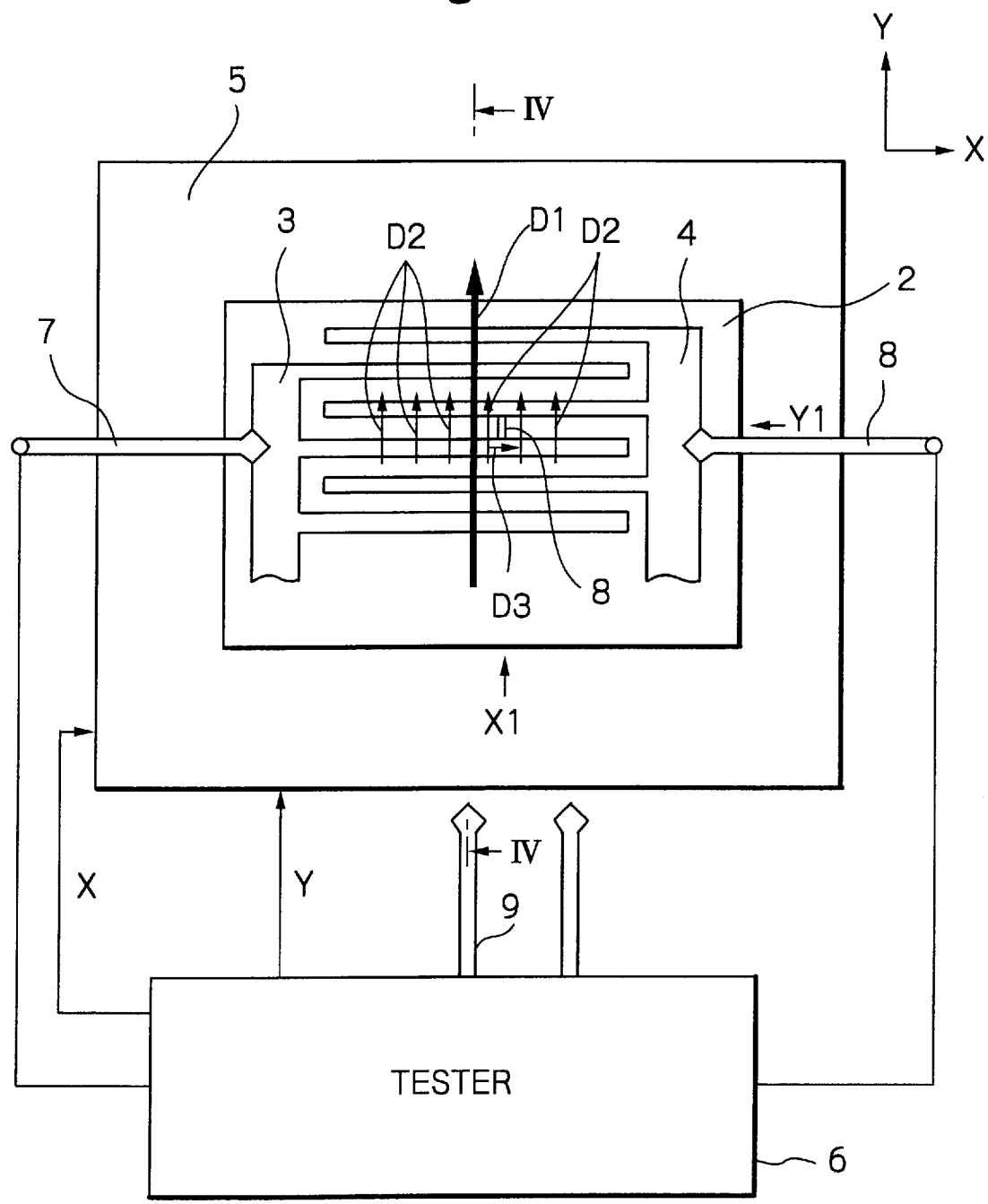
FIG. 3 is a diagram for explaining a first embodiment of the method for detecting line-shorts of a semiconductor device according to the present invention.
Figure 4:
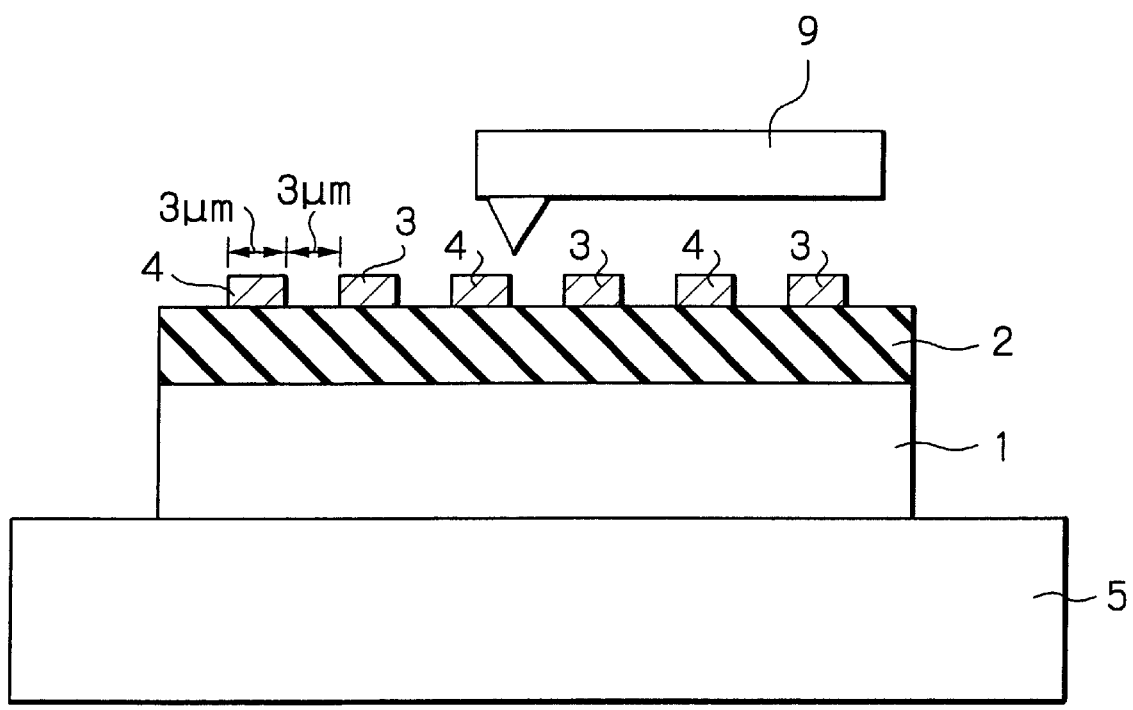
FIG. 4 is a cross-sectional view taken along the line IV—IV of FIG. 3.

FIG. 3 is a diagram for explaining a first embodiment of the method for detecting line-shorts of a semiconductor device according to the present invention, and FIG. 4 is a cross-sectional view taken along the line IV—IV of FIG. 3. In FIGS. 3 and 4, reference numeral 1 designates a semiconductor substrate on which an about 0.5 $\mu$m thick insulating layer 2 is formed. Also, two comb-shaped conductive layers 3 and 4 which interdigitate each other are formed on the insulating layer 2. In this case, the conductive layers 3 and 4 are made of aluminum, for example, and have about 3 $\mu$m wide pieces having a spacing of about 3 $\mu$m. Also, the combination of the conductive layers 3 and 4 have a size of about 1 mm×1 mm.

A semiconductor device formed by the elements 1, 2, 3 and 4 is mounted on a stage 5 which is driven along the X- and Y-directions by a tester 6. Note that the X direction is in parallel to the pieces of the comb-shaped conductive layers 3 and 4. On the other hand, the Y direction is perpendicular to the pieces of the comb-shaped conductive layers 3 and 4.

Also, probes 7 and 8 are placed on the pads of the conductive layers 3 and 4, respectively, and are connected to the tester 6.

Further, the tester 6 is operated to drive a scanning probe 9 of a scanning potential microscope (not shown) for detecting the potential distribution on the surface of the semiconductor device. The scanning potential microscope is an interleave type scanning potential microscope, a scanning Kelvin probe force microscope or a scanning Maxwell-stress microscope. Additionally, the tester 6 is operated to drive a probe 10 of an atomic force microscope (not shown) for mapping the surface atomic structure by measuring the force acting on the probe 10.

The tester 6 is constructed by a microcomputer or the like.

The operation of the tester 6 of FIG. 3 is explained next with reference to FIG. 5.

First, at step 501, a DC test is carried out by applying a DC voltage between the probes 7 and 8, to determine whether or not a current flows between the probes 7 and 8. Only when such a current flows, does the control proceed to step 502. Otherwise, the control proceeds directly to step 507.

Figure 6:
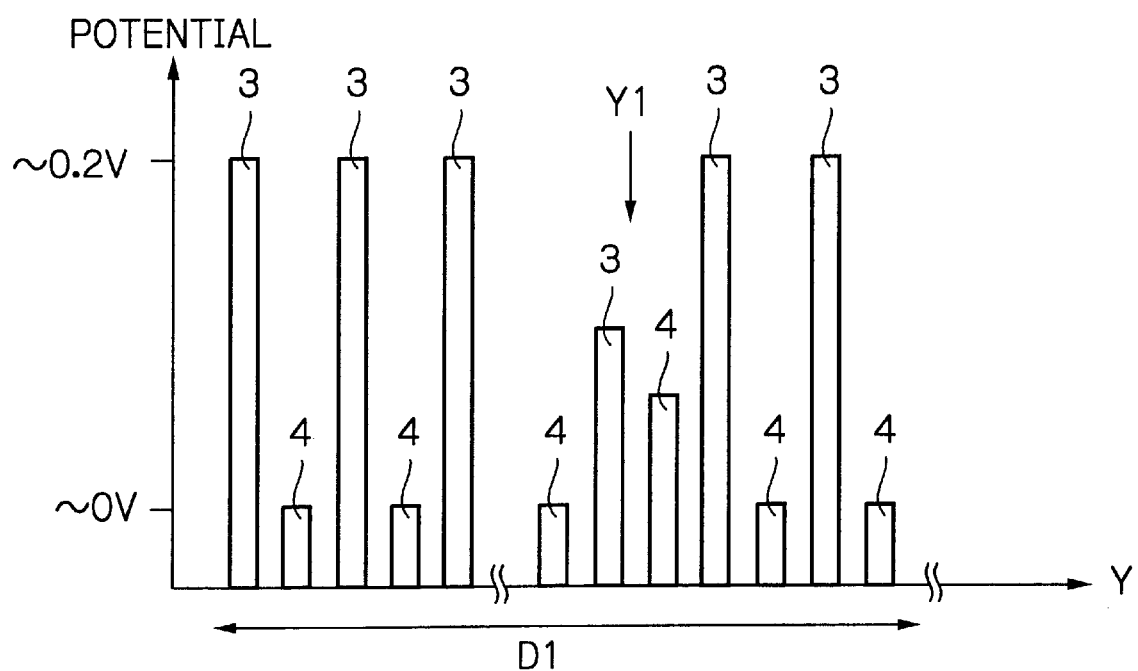
FIG. 6 is a diagram showing a potential distribution of the device of FIG. 3 along the direction D1 of FIG. 3.

At step 502, while a DC voltage of about 0.2V is applied between the probes 7 and 8, a first potential detecting operation is carried out by moving the probe 9 for a wide range D1 along the Y direction. For example, a potential distribution as shown in FIG. 6 is obtained by the scanning potential microscope. In this case, around Y=Y1, the potential at one piece of the comb-shaped conductive layer 3 is lower than the potential (about 0.2V) at the probe 7 and the potential at one piece of the comb-shaped conductive layer 4 is higher than the potential (about 0V) at the probe 8. Thus, one line-short is determined to be generated around Y=Y1.

Figure 7:
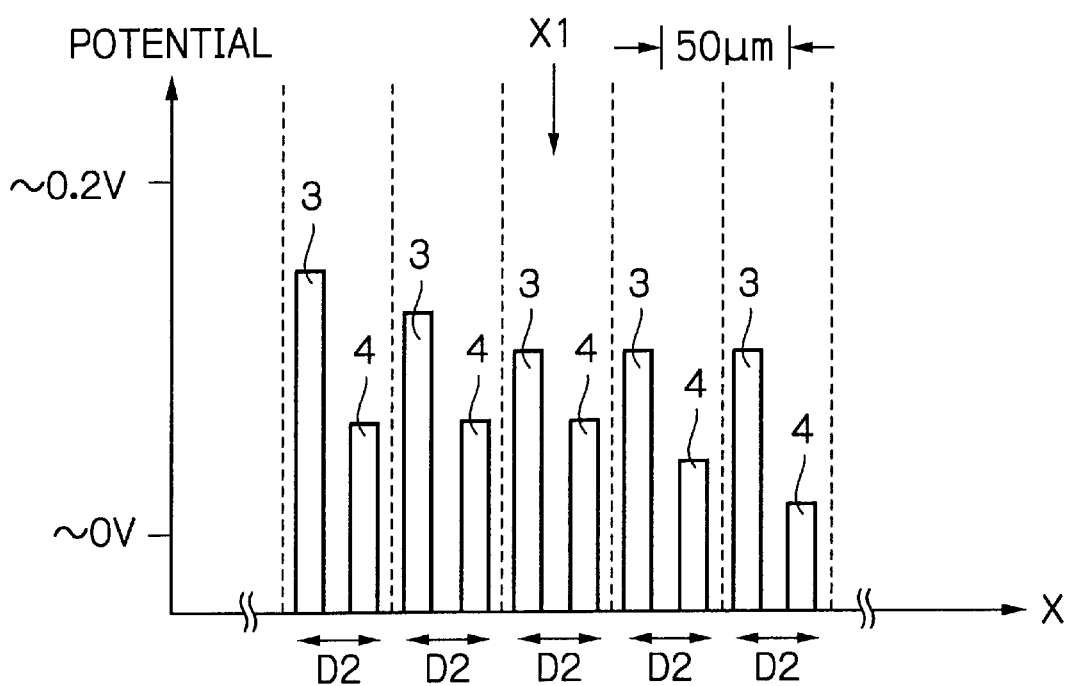
FIG. 7 is a diagram showing a potential distribution along the directions D2 of FIG. 3.

Next at step 503, a DC voltage of about 0.2V is applied between the probes 7 and 8, and then, a second potential detecting operation is carried out by moving the prove 9 for a narrow range D2 along the Y direction around Y=Y1 while shifting the probe 9 along the X direction by about 50 μm. For example, a potential distribution as shown in FIG. 7 is obtained by the scanning potential microscope. In this case, around X=X1, the difference in potential between one piece of the comb-shaped conductive layer 3 and one piece of the comb-shaped conductive layer 4 is minimum. Thus, one line-short is determined to be generated around X=X1.

Figure 8:
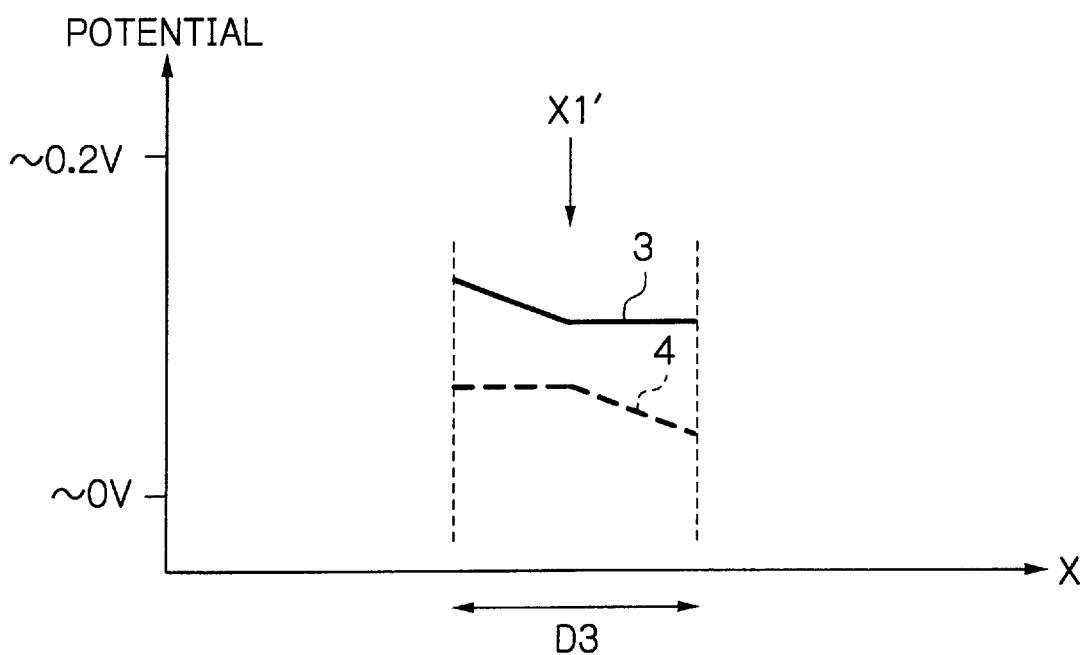
FIG. 8 is a diagram showing a potential distribution along the direction D3 of FIG. 3.

Next, at step 504, while a DC voltage of about 0.2V is applied between the probes 7 and 8, a third potential detecting operation is carried out by moving the probe 9 for a narrow range D3 along the X direction around (X1, Y1). For example, a potential distribution as shown in FIG. 8 is obtained by the scanning potential microscope. In this case, the potential at one piece of the comb-shaped conductive layer 3 is sharply changed as indicated by a solid line at X=X1' around X1. Thus, one line-short is determined to be accurately generated at X=X1'. Note that, if the probe 9 is moving on one piece of the comb-shaped conductive layer 4, the potential is sharply changed as indicated by a dotted line at X=X1'.

Next, at step 506, the tester 6 is operated to drive the probe 10 onto the location determined by (X1', Y1) to detect an accurate configuration of one line-short by the atomic force microscope.

Figure 5:
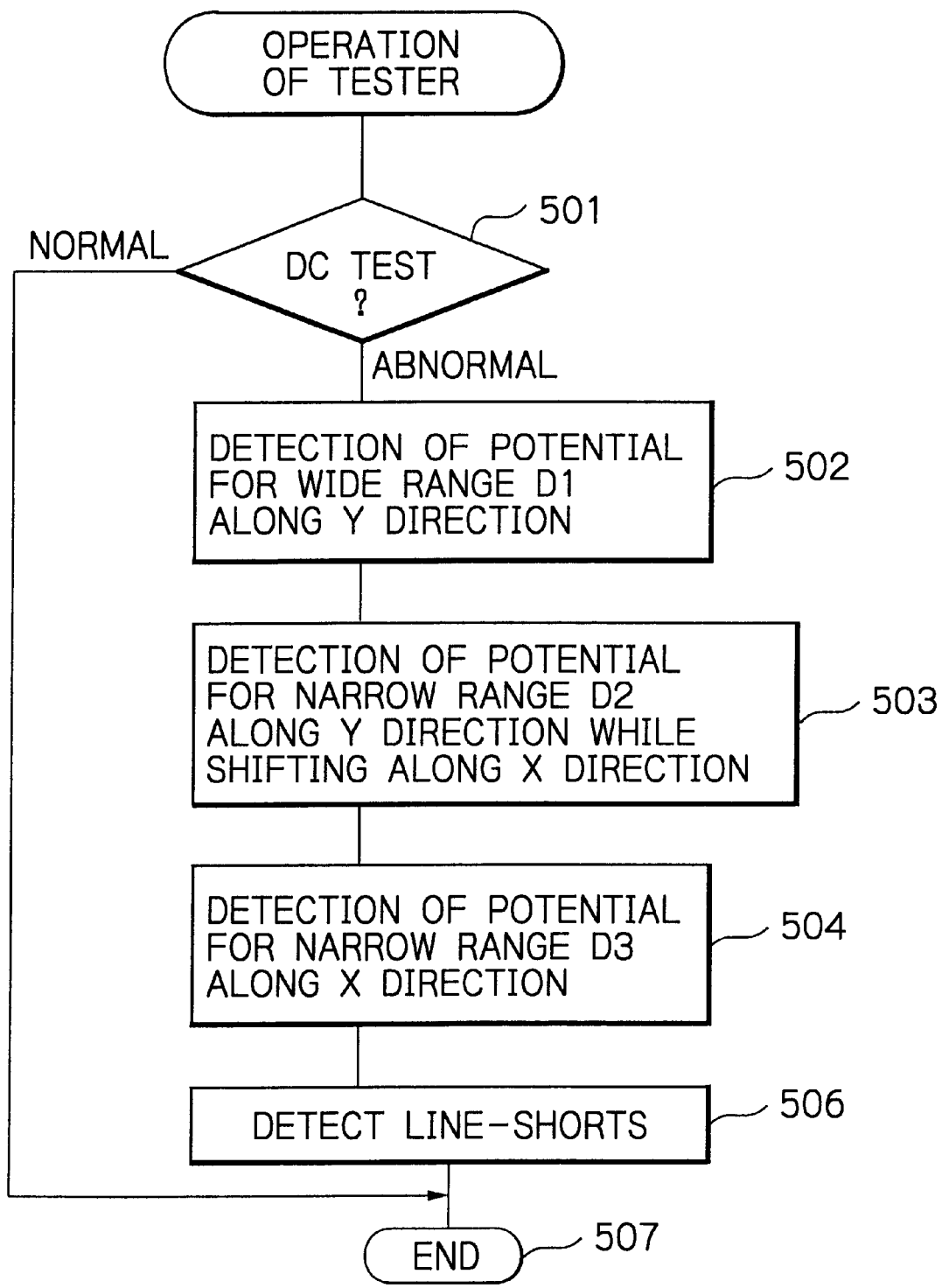
FIG. 5 is a flowchart showing the operation of the tester of FIG. 3.

Thus, the operation of FIG. 5 is completed by step 507.

In the above-described first embodiment, the probe 9 can serve as the probe 10, so that only one probe can be provided.

Figure 9:
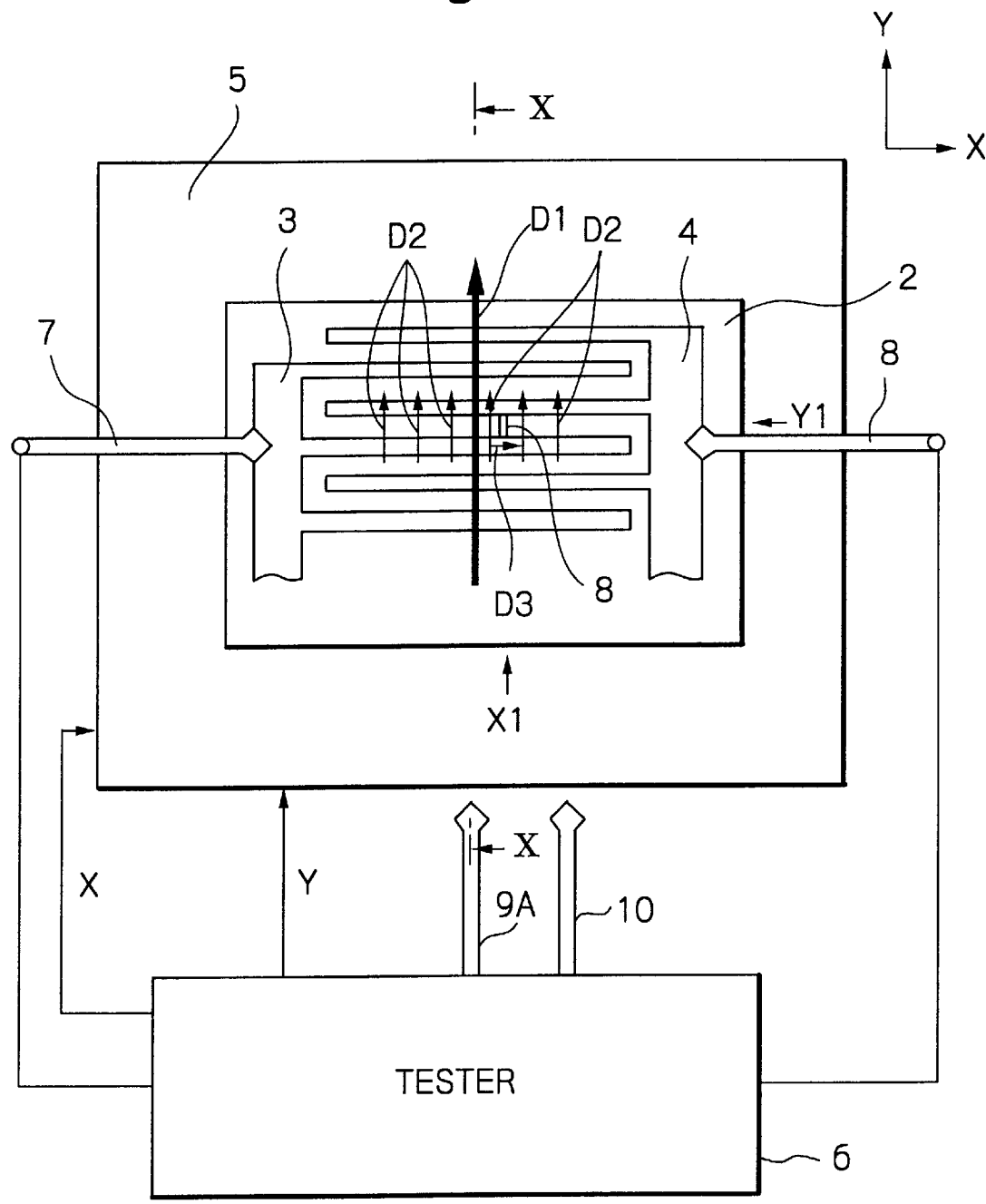
FIG. 9 is a diagram for explaining a second embodiment of the method for detecting line-shorts of a semiconductor device according to the present invention.
Figure 10:
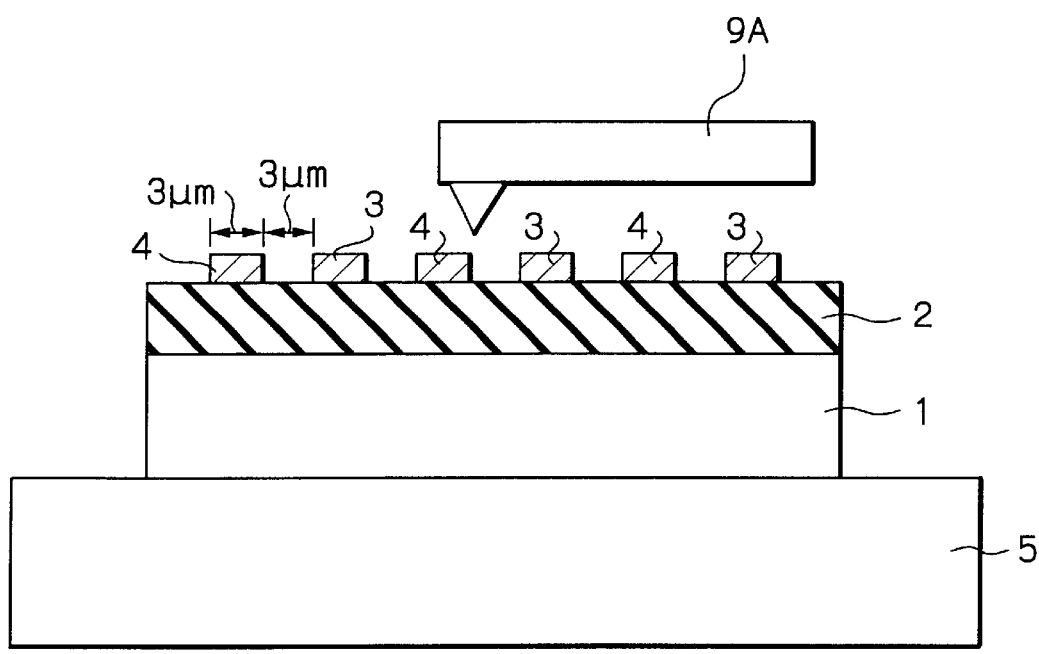
FIG. 10 is a cross-sectional view taken along the line X—X of FIG. 9.

FIG. 9 is a diagram for explaining a second embodiment of the method for detecting line-shorts of a semiconductor device according to the present invention, and FIG. 10 is a cross-sectional view taken along the line X—X of FIG. 9. In FIGS. 9 and 10, a scanning probe 9A of a scanning thermal microscope (not shown) is provided instead of the scanning probe 9 of the scanning potential microscope of FIG. 3, to detect the temperature distribution on the surface of the semiconductor device.

The operation of the tester 6 of FIG. 9 is explained next with reference to FIG. 11.

First, at step 1101, in the same way as at step 501, a DC test is carried out by applying a DC voltage between the probes 7 and 8, to determine whether or not a current flows between the probes 7 and 8. Only when such a current flows, does the control proceed to step 1102. Otherwise, the control proceeds directly to step 1107.

Figure 12:
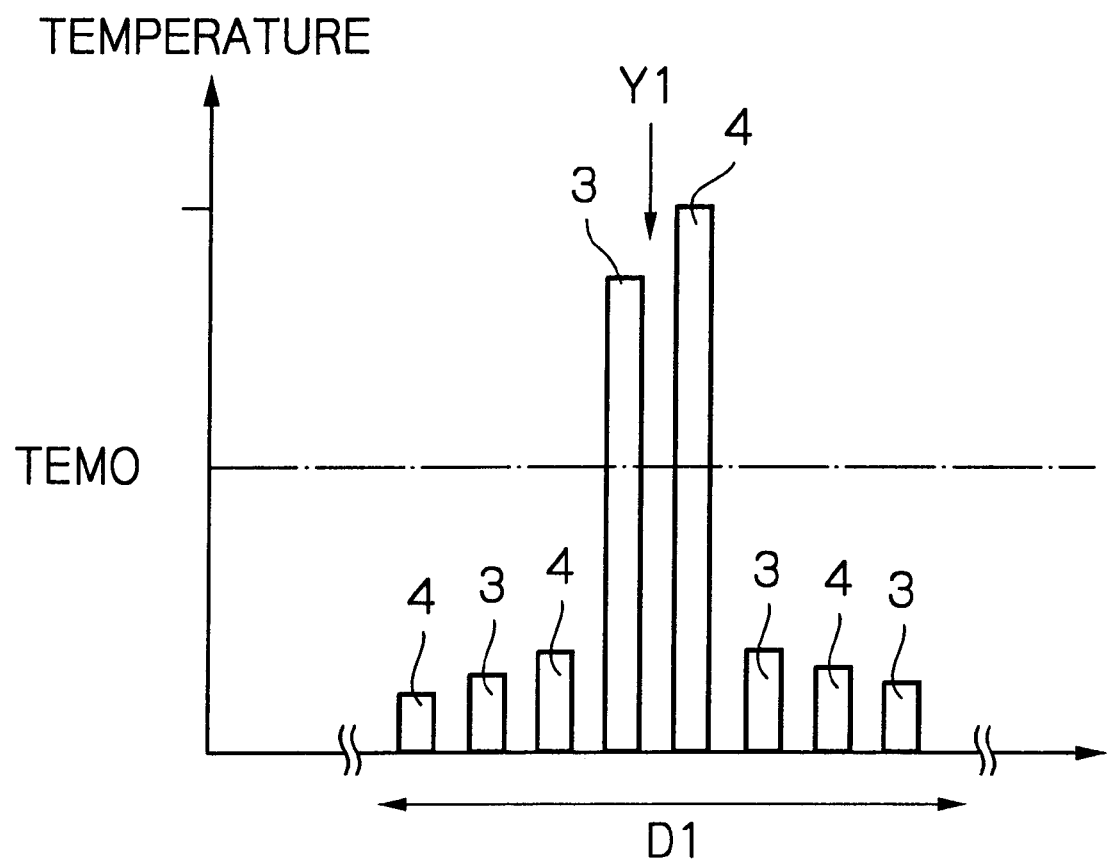
FIG. 12 is a diagram showing a temperature distribution of the tester of FIG. 9 along the direction D1 of FIG. 9.

At step 1102, while a DC voltage of about 0.2V is applied between the probes 7 and 8, a first temperature detecting operation is carried out by moving the probe 9A for a wide range D1 along the Y direction. For example, a temperature distribution as shown in FIG. 12 is obtained by the scanning thermal microscope. In this case, around Y=Y1, the temperature at one piece of the comb-shaped conductive layer 3 is much higher than a predetermined temperature TEM0 and the potential at one piece of the comb-shaped conductive layer 4 is also much higher than the pretermined temperature TEM0. Thus, one line-short is determined to be generated around Y=Y1.

Figure 13:
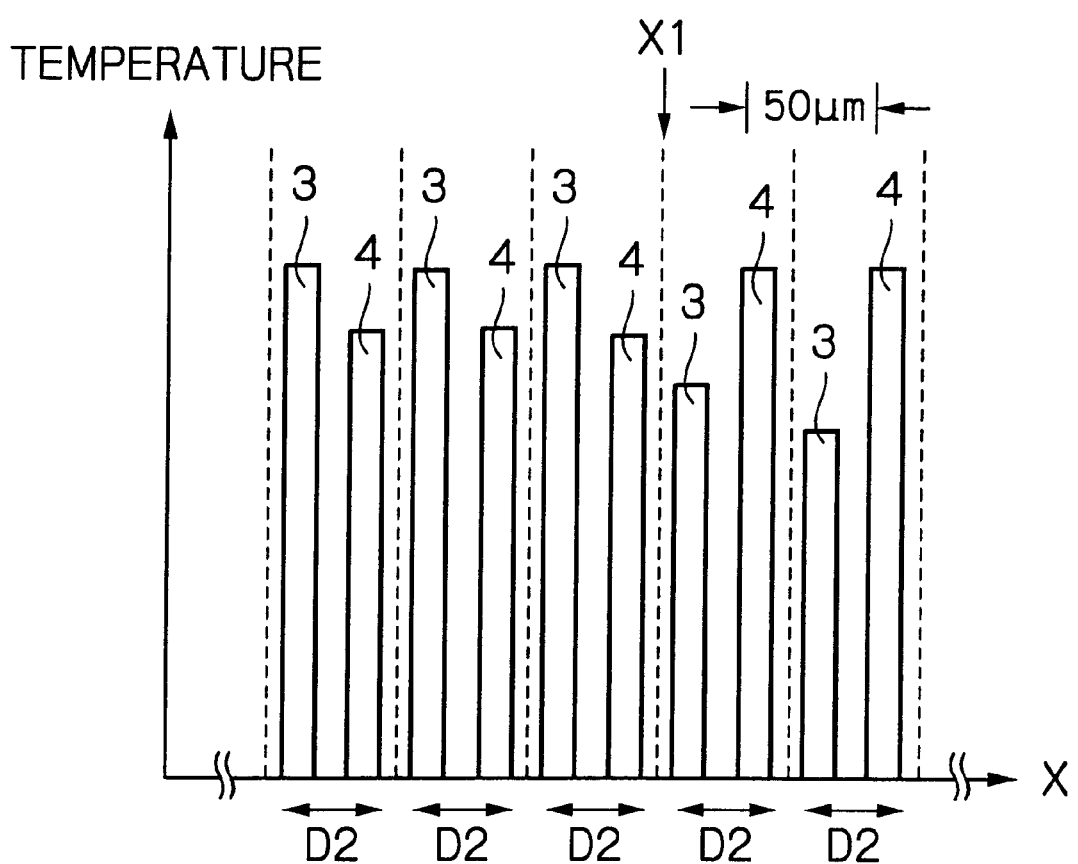
FIG. 13 is a diagram showing a temperature distribution along the directions D2 of FIG. 9.

Next at step 1103, a DC voltage of about 0.2V is applied between the probes 7 and 8, and then, a second temperature detecting operation is carried out by moving the prove 9A for a narrow range D2 along the Y direction around Y=Y1 while shifting the probe 9A along the X direction by about 50 μm. For example, a temperature distribution as shown in FIG. 13 is obtained by the scanning temperature microscope. In this case, around X=X1, the difference in temperature between one piece of the comb-shaped conductive layer 3 and one piece of the comb-shaped conductive layer 4 is inverted. Thus, one line-short is determined to be generated around X=X1.

Figure 14:
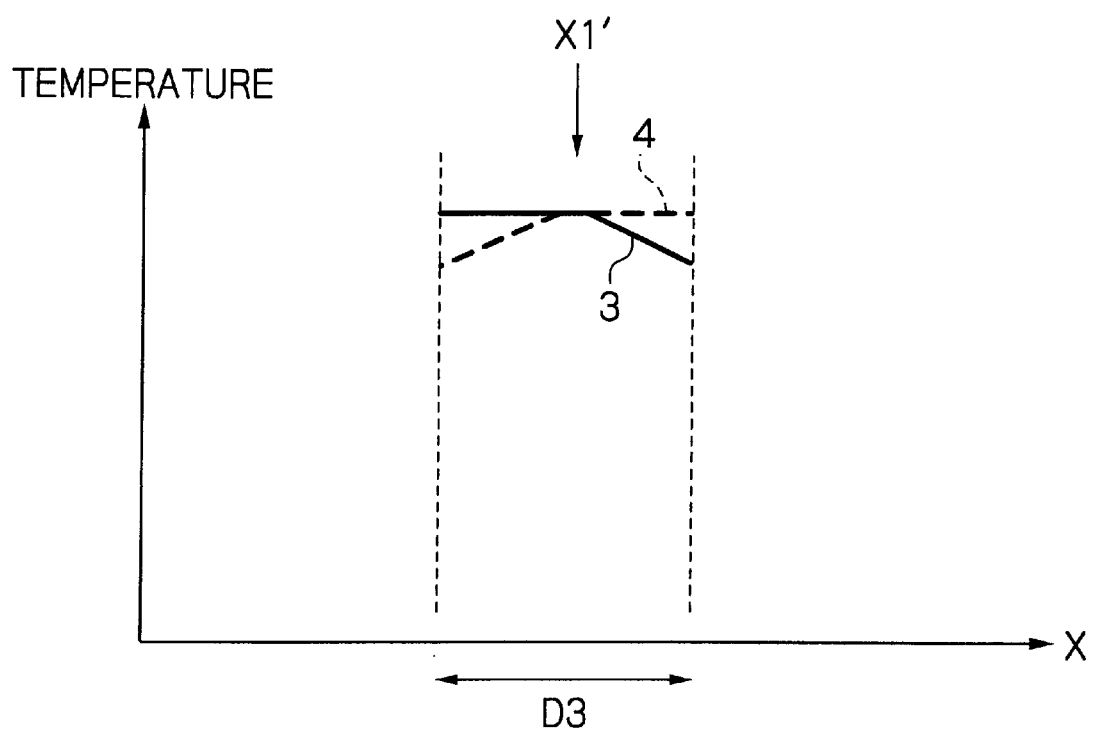
FIG. 14 is a diagram showing a temperature distribution along the direction D3 of FIG. 9.
Figure 15:
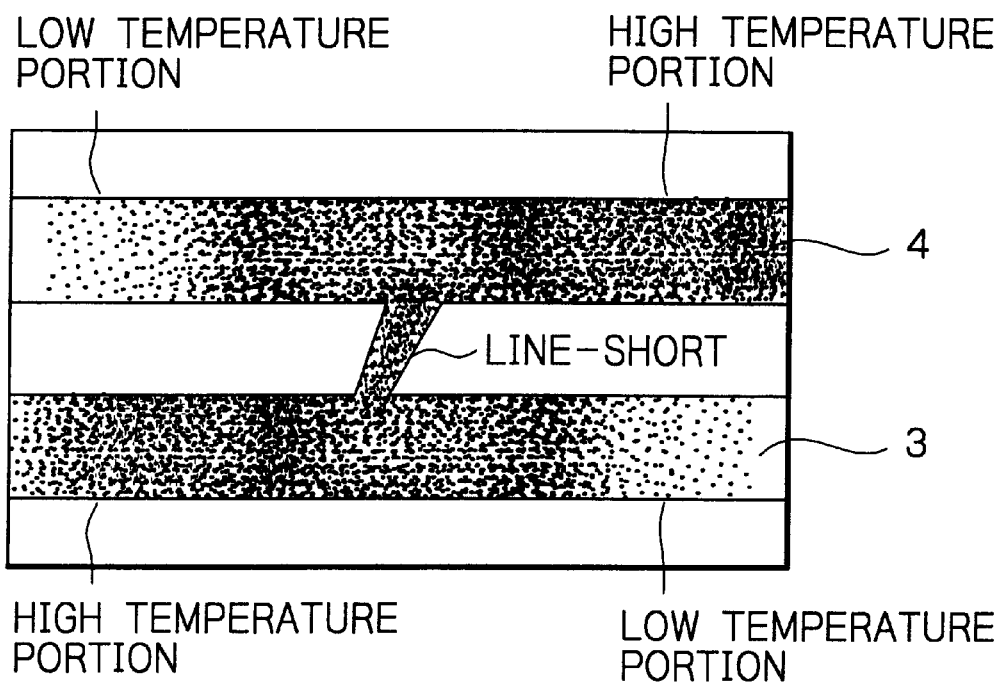
FIG. 15 is a plan view showing a temperature distribution of the comb-shaped conductive layers of FIG. 9 around one line-short.

Next, at step 1104, while a DC voltage of about 0.2V is applied between the probes 7 and 8, a third temperature detecting operation is carried out by moving the probe 9A for a narrow range D3 along the X direction around (X1, Y1). For example, a temperature distribution as shown in FIG. 14 is obtained by the scanning temperature microscope. In this case, the temperature at one piece of the comb-shaped conductive layer 3 is sharply changed as indicated by a solid line at X=X1' around X1. Thus, one line-short is determined to be accurately generated at X=X1'. Note that, if the probe 9A is moving on one piece of the comb-shaped conductive layer 4, the temperature is sharply changed as indicated by a dotted line at X=X1'. In this case, note that the temperature distribution around the line-short is shown in FIG. 15.

Next, at step 1106, the tester 6 is operated to drive the probe 10 onto the location determined by (X1', Y1) to detect an accurate configuration of one line-short by the atomic force microscope.

Figure 11:
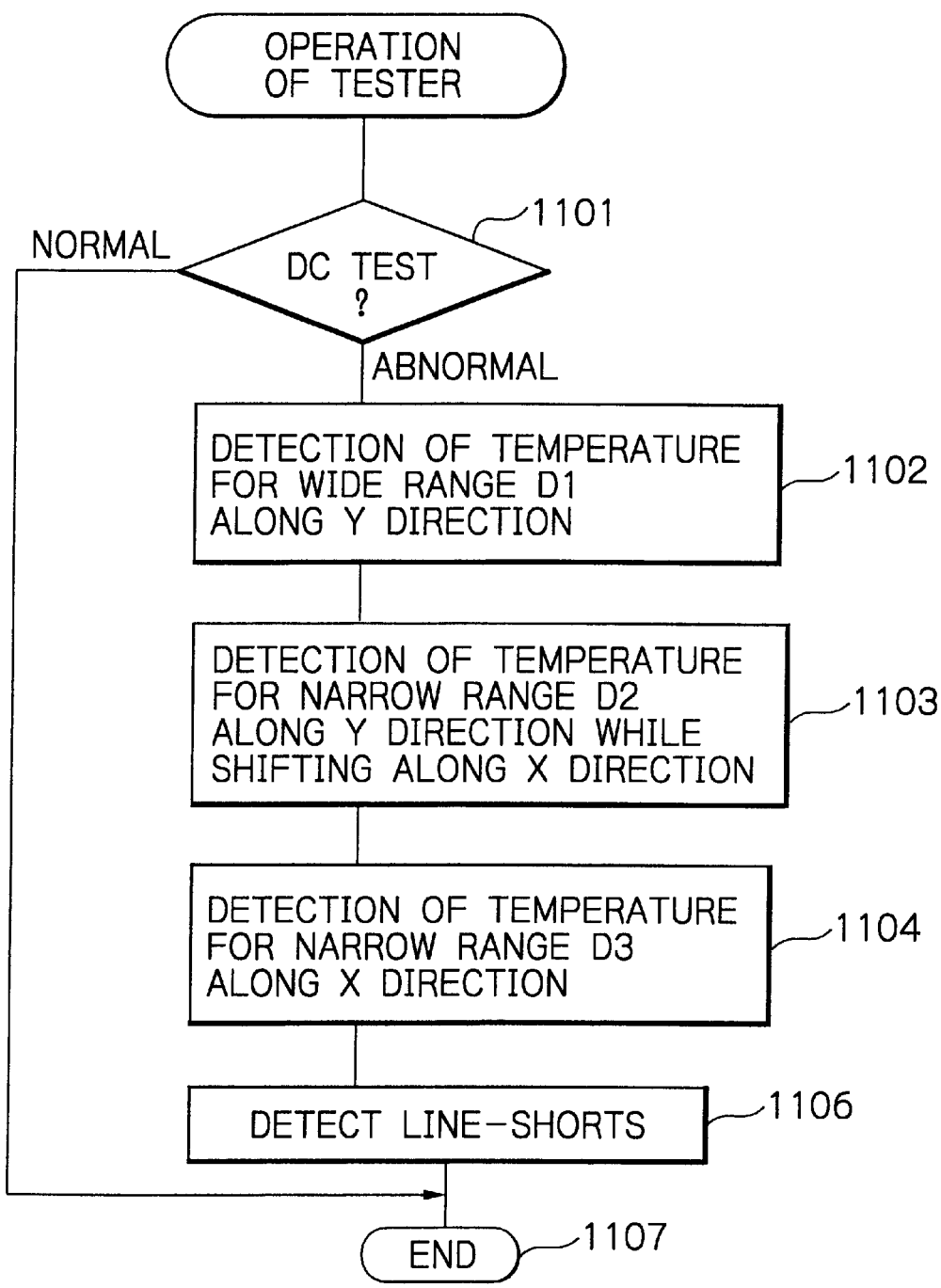
FIG. 11 is a flowchart showing the operation of the tester of FIG. 9.

Thus, the operation of FIG. 11 is completed by step 1107.

In the first embodiment, the potential distribution is subject to the charge-up phenomenon of the insulating layer 2.

On the other hand, in the second embodiment, the temperature distribution is not subject to the charge-up phenomenon of the insulating layer 2.

In the above-described embodiments, the tester 6 is combined with the scanning potential (or thermal) microscope and the atomic force microscope.

As explained hereinabove, according to the present invention, since a potential or temperature detecting operation is carried out without using vacuum equipment, the inspection apparatus can be inexpensive. Also, since it is unnecessary to adhere conductive tapes, the burden of line-short inspection can be decreased.

What is claimed is:

1. A method for detecting a line-short between conductive layers comprising a step of detecting a potential distribution of said conductive layers while applying a DC voltage thereto, wherein said potential distribution detecting step comprises the steps of:

detecting a first potential distribution for a wide range along a first direction perpendicular to said conductive layers, to determine a first location whose potential is at an intermediate level of said DC voltage;

detecting a second potential distribution for a narrow range along said first direction around said first location while shifting along a second direction in parallel to said conductive layers, to determine a second location whose difference in potential between said conductive layers is minimum, thus determining that one line-short is generated at a location defined by said first and second locations; and detecting a third potential distribution for a narrow range along said second direction around said first and second locations, to determine a third location whose potential is sharply changed, thus determining that said one line-short is generated at a location defined by said first and third locations.

2. The method as set forth in claim 1, further comprising a step of detecting a configuration of said generated line-short.

3. The method as set forth in claim 1, further comprising a step of detecting a configuration of said generated line-short.

4. The method as set forth in claim 1, further comprising a step of performing a DC test upon said conductive layers before said potential distribution detecting step is carried out, said potential distribution detecting step being carried out only when said DC test results in an abnormal state.

5. A method for detecting a line-short between first and second comb-shaped conductive layers interdigitating each other, comprising the steps of:

performing a DC test upon said first and second comb-shaped conductive layers;

only when said DC test results in an abnormal state, detecting a first potential distribution for a wide range along a first direction perpendicular to pieces of said first and second comb-shaped conductive layers while a DC voltage is applied to said first and second comb-shaped conductive layers, to determine a first location whose potential is at an intermediate level of said DC voltage;

detecting a second potential distribution for a narrow range along said first direction around said first location while shifting along a second direction in parallel to the pieces of said first and second comb-shaped conductive layers to determine a second location whose difference in potential between said first and second comb-shaped conductive layers is minimum, thus determining that one line-short is generated at a location defined by said first and second locations; and detecting a third potential distribution for a narrow range along one of the pieces of said first and second comb-shaped conductive layers around said first and second locations, to determine a third location whose potential is sharply changed, thus determining that said one line-short is generated at a location defined by said first and third locations.

6. The method as set forth in claim 5, further comprising a step of detecting a configuration of said generated line-short.

7. The method as set forth in claim 5, further comprising a step of detecting a configuration of said generated line-short.

8. A method for detecting a line-short between conductive layers comprising a step of detecting a temperature distribution of said conductive layers while applying a DC voltage thereto, wherein said temperature distribution detecting step comprises the steps of:

detecting a first temperature distribution for a wide range along a first direction perpendicular to said conductive layers, to determine a first location whose temperature is higher than a predetermined temperature;

detecting a second temperature distribution for a narrow range along said first direction around said first location while shifting along a second direction in parallel to said conductive layers, to determine a second location whose difference in temperature between said conductive layers is inverted, thus determining that one line-short is generated at a location defined by said first and second locations; and detecting a third temperature distribution for a narrow range along said second direction around said first and second locations, to determine a third location whose temperature is sharply changed, thus determining that said one line-short is generated at a location defined by said first and third locations.

9. The method as set forth in claim 8, further comprising a step of detecting a configuration of said generated line-short.

10. The method as set forth in claim 8, further comprising a step of detecting a configuration of said generated line-short.

11. The method as set forth in claim 8, further performing a DC test upon said conductive layers before said temperature distribution detecting step is carried out, said temperature distribution detecting step being carried out only when said DC test results in an abnormal state.

12. A method for detecting a line-short between first and second comb-shaped conductive layers interdigitating each other, comprising the steps of:

performing a DC test upon said first and second comb-shaped conductive layers;

only when said DC test results in an abnormal state, detecting a first temperature distribution for a wide range along a first direction perpendicular to pieces of said first and second comb-shaped conductive layers while a DC voltage is applied to said first and second comb-shaped conductive layers, to determine a first location whose temperature is higher than a predetermined temperature;

detecting a second temperature distribution for a narrow range along said first direction around said first location while shifting along a second direction in parallel to the pieces of said first and second comb-shaped conductive layers to determine a second location whose difference in temperature between said first and second comb-shaped conductive layers is inverted, thus determining that one line-short is generated at a location defined by said first and second locations; and detecting a third temperature distribution for a narrow range along one of the pieces of said first and second comb-shaped conductive layers around said first and second locations, to determine a third location whose temperature is sharply changed, thus determining that said one line-short is generated at a location defined by said first and third locations.

13. The method as set forth in claim 12, further comprising a step of detecting a configuration of said generated line-short.

14. The method as set forth in claim 12, further comprising a step of detecting a configuration of said generated line-short.

15. An apparatus for detecting a line-short between conductive layers comprising a scanning potential microscope for detecting a potential distribution of said conductive layers while applying a DC voltage thereto, wherein said scanning potential microscope comprises:

means for detecting a first potential distribution for a wide range along a first direction perpendicular to said conductive layers, to determine a first location whose potential is at an intermediate level of said DC voltage;

means for detecting a second potential distribution for a narrow range along said first direction around said first location while shifting along a second direction in parallel to said conductive layers, to determine a second location whose difference in potential between said conductive layers is minimum, thus determining that one line-short is generated at a location defined by said first and second locations; and means for detecting a third potential distribution for a narrow range along said second direction around said first and second locations, to determine a third location whose potential is sharply changed, thus determining that said one line-short is generated at a location defined by said first and third locations.

16. The method as set forth in claim 15, further comprising an atomic force microscope for detecting a configuration of said generated line-short.

17. The apparatus as set forth in claim 15, further comprising an atomic force microscope for detecting a configuration of said generated line-short.

18. The apparatus as set forth in claim 15, further comprising a tester for performing a DC test upon said conductive layers before said potential distribution is detected,
said scanning potential microscope being operated only when said DC test results in an abnormal state.

19. An apparatus for detecting a line-short between first and second comb-shaped conductive layers interdigitating each other, comprising:
a tester for performing a DC test upon said first and second comb-shaped conductive layers;
a scanning potential microscope for detecting a first potential distribution for a wide range along a first direction perpendicular to pieces of said first and second comb-shaped conductive layers while a DC voltage is applied to said first and second comb-shaped conductive layers, to determine a first location whose potential is at an intermediate level of said DC voltage, and detecting a second potential distribution for a narrow range along said first direction around said first location while shifting along a second direction in parallel to the pieces of said first and second comb-shaped conductive layers to determine a second location whose difference in potential between said first and second comb-shaped conductive layers is minimum, thus determining that one line-short is generated at a location defined by said first and second locations, and for detecting a third potential distribution for a narrow range along one of the pieces of said first and second comb-shaped conductive layers around said first and second locations, to determine a third location whose potential is sharply changed, thus determining that said one line-short is generated at a location defined by said first and third locations.

20. The apparatus as set forth in claim 19, further comprising an atomic force microscope for detecting a configuration of said generated line-short.

21. The apparatus as set forth in claim 19, further comprising an atomic force microscope for detecting a configuration of said generated line-short.

22. An apparatus for detecting a line-short between conductive layers comprising a scanning thermal microscope for detecting a temperature distribution of said conductive layers while applying a DC voltage thereto, wherein said scanning thermal microscope comprises:
means for detecting a first temperature distribution for a wide range along a first direction perpendicular to said conductive layers, to determine a first location whose temperature is higher than a predetermined temperature, and detecting a second temperature distribution for a narrow range along said first direction around said first location while shifting along a second direction in parallel to said conductive layers, to determine a second location whose difference in temperature between said conductive layers is inverted, thus determining that one line-short is generated at a location defined by said first and second locations, and for detecting a third temperature distribution for a narrow range along said second direction around said first and second locations, to determine a third location whose temperature is sharply changed, thus determining that said one line-short is generated at a location defined by said first and third locations.

23. The apparatus as set forth in claim 22, further comprising an atomic force microscope for detecting a configuration of said generated line-short.

24. The apparatus as set forth in claim 22, further comprising an atomic force microscope for detecting a configuration of said generated line-short.

25. The apparatus as set forth in claim 22, further comprising a tester for performing a DC test upon said conductive layers before said temperature distribution is detected,
said scanning thermal microscope being operated only when said DC test results in an abnormal state.

26. An apparatus for detecting a line-short between first and second comb-shaped conductive layers interdigitating each other, comprising:
a tester for performing a DC test upon said first and second comb-shaped conductive layers;
a scanning thermal microscope for detecting a first temperature distribution for a wide range along a first direction perpendicular to pieces of said first and second comb-shaped conductive layers while a DC voltage is applied to said first and second comb-shaped conductive layers, to determine a first location whose temperature is higher than a predetermined temperature, and detecting a second temperature distribution for a narrow range along said first direction around said first location while shifting along a second direction in parallel to the pieces of said first and second comb-shaped conductive layers to determine a second location whose difference in temperature between said first and second comb-shaped conductive layers is inverted, thus determining that one line-short is generated at a location defined by said first and second locations, and for detecting a third temperature distribution for a narrow range along one of the pieces of said first and second comb-shaped conductive layers around said first and second locations, to determine a third location whose temperature is sharply changed, thus determining that said one line-short is generated at a location defined by said first and third locations.

27. The apparatus as set forth in claim 26, further comprising an atomic force microscope for detecting a configuration of said generated line-short.

28. The apparatus as set forth in claim 26, further comprising an atomic force microscope for detecting a configuration of said generated line-short.

* * * * *